United States Patent
Chien et al.

(10) Patent No.: US 6,815,770 B1
(45) Date of Patent: Nov. 9, 2004

(54) MOS TRANSISTOR HAVING REDUCED SOURCE/DRAIN EXTENSION SHEET RESISTANCE

(75) Inventors: Chin-Cheng Chien, Hsin-Chu (TW); Hsiang-Ying Wang, Chia-Yi Hsien (TW); Yu-Kun Chen, Hsin-Chu (TW); Neng-Hui Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/604,741

(22) Filed: Aug. 14, 2003

(51) Int. Cl.$^7$ ................................. H01L 29/78
(52) U.S. Cl. .................. 257/344; 257/335; 257/336
(58) Field of Search ........................ 257/344, 335, 257/336

(56) References Cited

U.S. PATENT DOCUMENTS 6,246,091 B1 * 6/2001 Rodder ..................... 257/335
6,278,165 B1 * 8/2001 Oowaki et al. ............. 257/410
6,323,525 B1 * 11/2001 Noguchi et al. ............ 257/385
6,406,973 B1 * 6/2002 Lee ........................... 438/416

* cited by examiner

Primary Examiner—Jerome Jackson
(74) Attorney, Agent, or Firm—Winston Hsu

(57) ABSTRACT

The present invention provides a novel MOS transistor structure. The MOS transistor includes a gate electrode formed on a semiconductor substrate, and a gate oxide layer formed between the gate electrode and the semiconductor substrate. A spacer is formed on each sidewall of the gate electrode. A lightly doped source/drain extension is formed under the spacer with a raised epitaxial layer interposed between the spacer and the semiconductor substrate. The epitaxial layer, which is part of the lightly doped source/drain extension, has a lattice constant that is greater than the lattice constant of silicon crystal. The epitaxial layer serves as a solubility enhancement layer that is capable of increasing active boron concentration, thereby reducing sheet resistance of the source/drain extension. A heavily doped source/drain region is formed in the semiconductor substrate next to the edge of the spacer. A raised silicide layer is formed on the heavily doped source/drain region.

13 Claims, 12 Drawing Sheets

U.S. 6,815,770 B1

MOS TRANSISTOR HAVING REDUCED SOURCE/DRAIN EXTENSION SHEET RESISTANCE

BACKGROUND OF INVENTION

1. Field of the Invention

The present invention relates to a metal-oxide-semiconductor (MOS) transistor structure and, more particularly, to a MOS transistor structure having reduced sheet resistance in ultra-shallow source/drain extension regions and method of fabrication.

2. Description of the Prior Art

Continued device scaling demands that source/drain (S/D) junctions of MOS transistor devices become thinner and thinner to avoid short channel effect. However, the prior art MOS structure has a drawback in that the shallower the S/D extension is, the greater the sheet resistance occurs in operation. As known to those skilled in the art, large sheet resistance leads to insufficient saturation currents. The situation becomes worse when the MOS device is a FIG. 1 is a schematic cross-sectional diagram showing a prior art PMOS transistor 10 having ultra-shallow junction S/D extensions 32. The prior art PMOS transistor 10 includes a poly gate 12 formed on an N well 16 of a silicon substrate. A gate oxide layer 14 is formed between the gate 12 and the silicon substrate. Spacers 18 are disposed on opposite sidewalls of the gate 12. A P⁻ ultra-shallow junction S/D extension 32 is formed underneath the spacer 18 within the N well 16. Next to the outer edge to the spacer 18, a raised silicide layer 42 is provided on P⁺ source/drain region 34. A silicide layer 44 is formed on the top of the poly gate 12. Typically, the spacer 18 consists of an offset oxide spacer 21 stuck to the sidewall of the poly gate 12, an oxide liner 22, and a nitride spacer 23. As specifically indicated in this figure, the oxide liner 22 covers the offset oxide spacer 21 and its lower portion extends laterally to directly cover and borders the P⁻ ultra-shallow junction S/D extension 32.

The P⁻ ultra-shallow junction S/D extension 32 is formed after the formation of the pair of offset spacers 21 through low-energy ion implantation. Using the gate 12 the offset spacers 21 as an implant mask, dopants h as boron are doped into the N well 16 of the silicon substrate to a depth such as for example 20 to 30 nanometers below the surface of the silicon substrate. A or laser annealing process is then carried out to activate the dopants trapped in the silicon crystal at 900 to 1000° C. in a few seconds.

However, the above-mentioned prior art PMOS transistor 10 encounters a bottleneck that the sheet resistance in the P⁻ ultra-shallow junction S/D extension 32 cannot not be further reduced due to the fact that the active boron concentration in silicon substrate is limited by borons solid solubility thereof.

SUMMARY OF INVENTION

Accordingly, the primary object of the present invention is to provide a novel MOS transistor structure capable of reducing sheet resistance in the source/drain extensions.

It is another object of the present invention to provide an advanced MOS transistor structure having ultra-shallow junction source/drain extensions with active boron concentration that is greater than the maximum boron solid solubility in silicon within a certain junction depth.

To these ends, in one aspect of this invention, a MOS transistor includes a gate electrode formed on a semiconductor substrate, and a gate insulating layer formed between the gate electrode and the semiconductor substrate. A spacer is disposed on each sidewall of the gate electrode. A lightly doped source/drain (S/D) extension is formed in the semiconductor substrate under the spacer. The lightly doped S/D extension comprises a raised epitaxial layer bordering bottom of the spacer. A heavily doped S/D region is formed in the semiconductor substrate next to an outer edge of the spacer. A silicide layer is formed on the heavily doped S/D region. The epitaxial layer has a lattice constant that is greater than the lattice constant of single silicon crystal.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
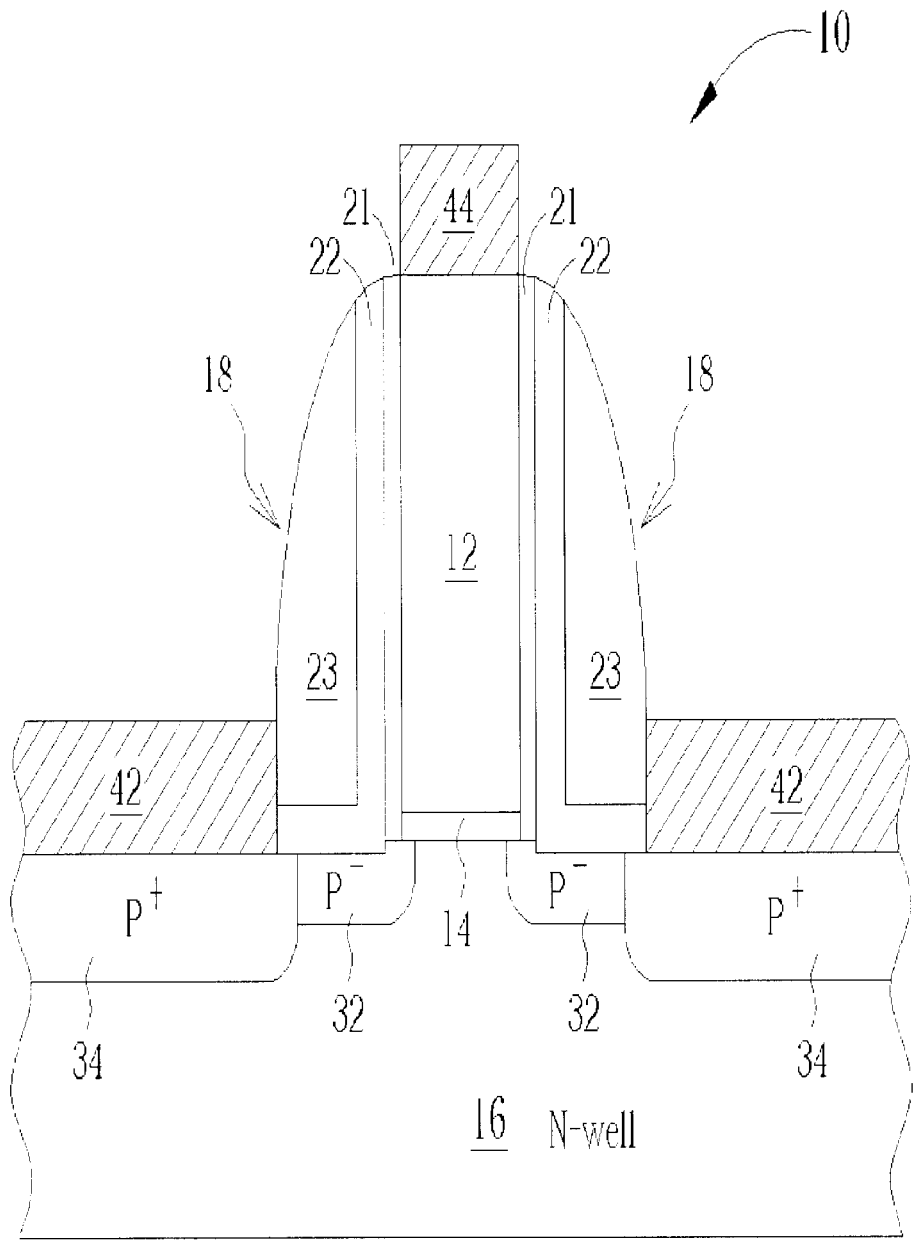
FIG. 1 is a schematic cross-sectional diagram showing a prior art MOS transistor having ultra-shallow junction S/D extensions.
Figure 2:
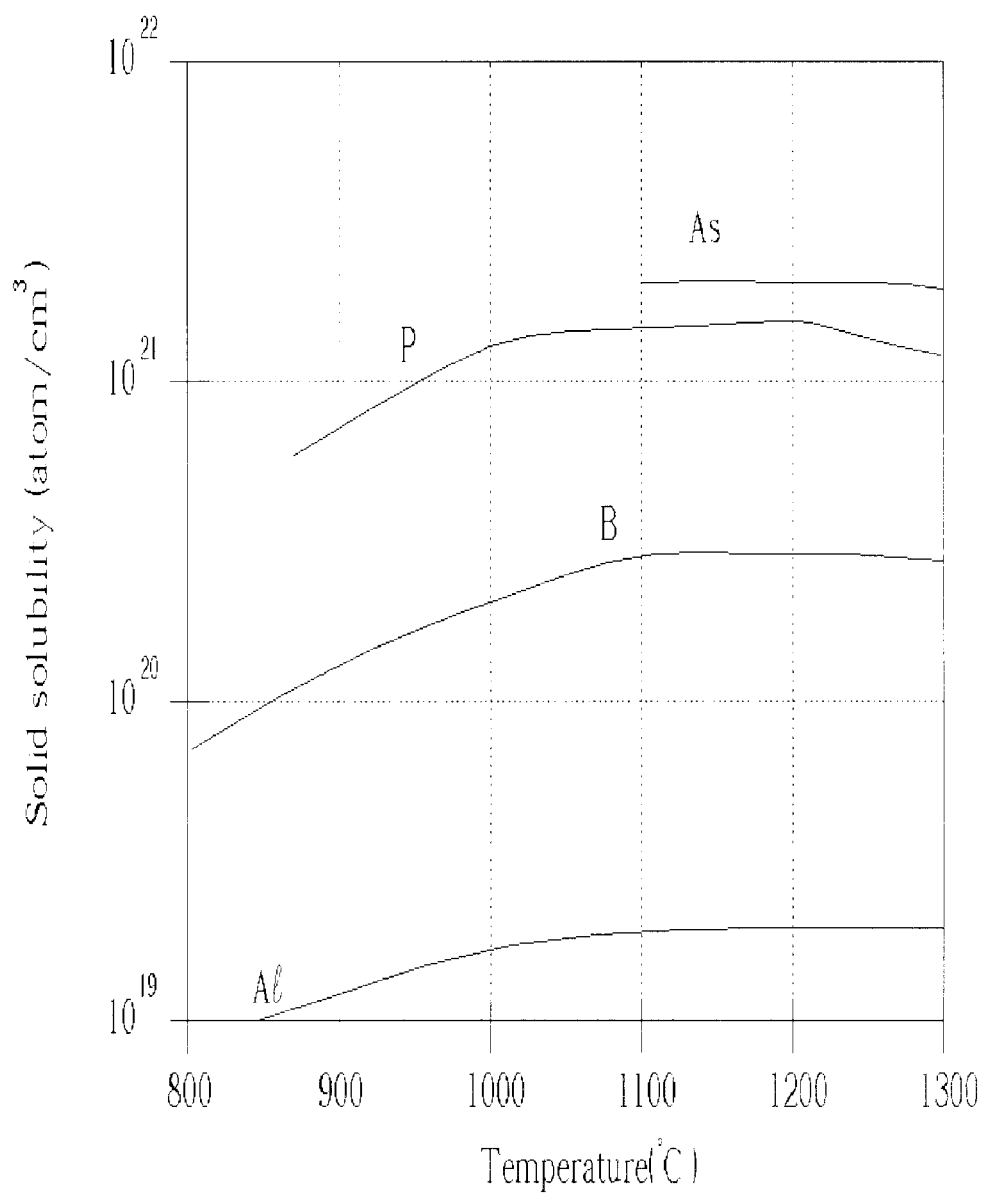
FIG. 2 is a chart illustrating solid solubility in single crystal silicon substrate of various elements including arsenic, phosphor, boron, and aluminum, at different annealing temperatures.
Figure 3:
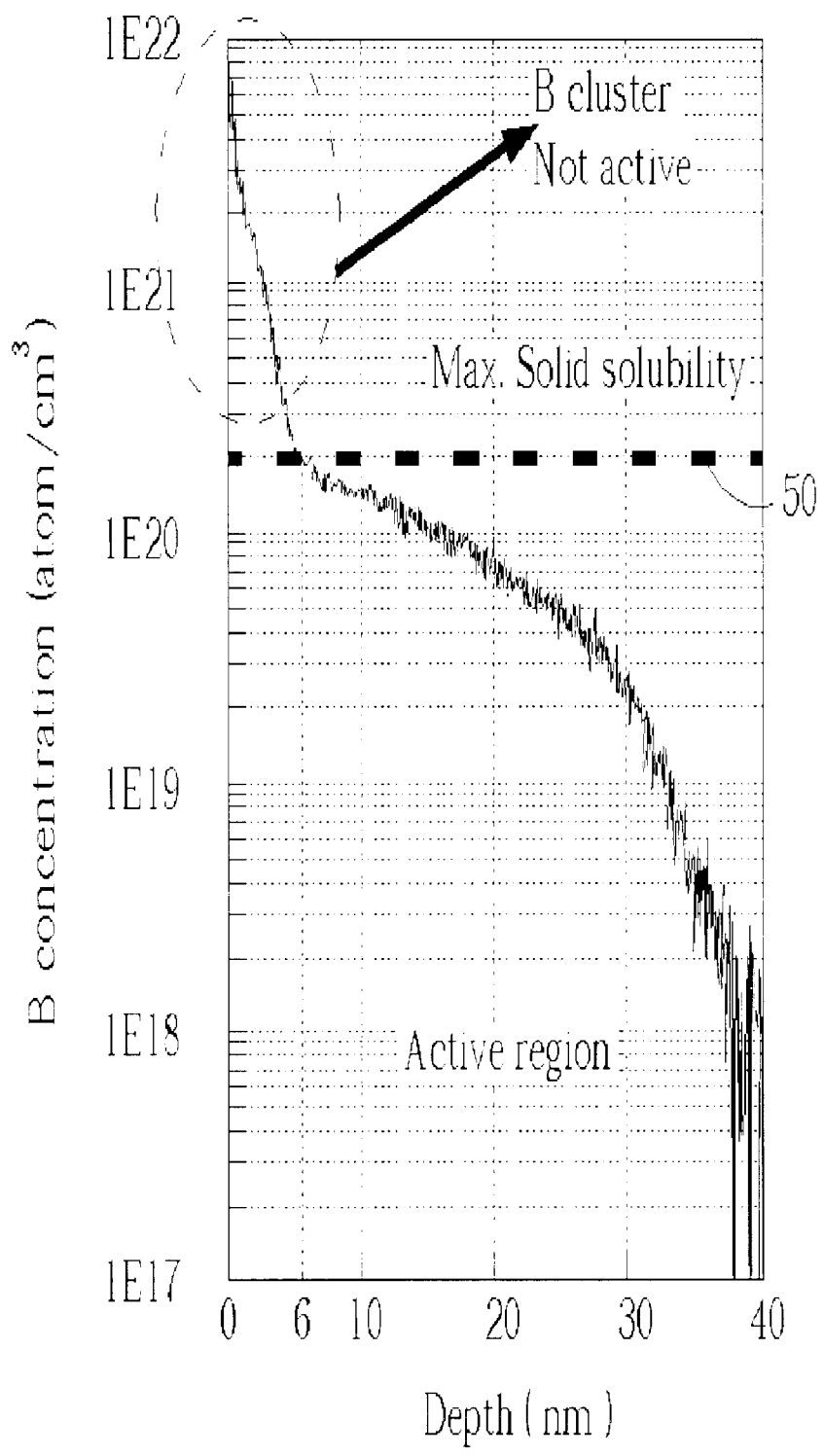
FIG. 3 is a boron concentration vs. depth plot based on secondary ion mass spectroscopy (SIMS) analysis on the P⁻ ultra-shallow junction S/D extension 32 (annealing temperature: 1000° C.

Please refer to FIG. 2, FIG. 3, and briefly back to FIG. 1. FIG. 2 is a chart illustrating solid solubility in single crystal silicon substrate of various elements including arsenic, phosphor, boron, and aluminum, at different annealing temperatures. FIG. 3 is a boron concentration vs. depth plot based on secondary ion mass spectroscopy (SIMS) analysis on the P⁻ ultra-shallow junction S/D extension 32 (annealing temperature: 1000° C.). As shown in FIG. 2, at an annealing temperature of 1000° C., the maximum solid solubility of boron is about 2E20 atoms/cm³. In FIG. 3, the maximum solid solubility of boron is indicated with dash line 50. As shown in FIG. 3, above the dash line 50, which corresponds to a junction depth of about 5 to 6 nanometers (50~60 angstroms) below the surface of the silicon substrate, though boron concentration exceeds the maximum solid solubility of boron, however, the excess boron dopants are not active because they are in cluster form (cluster boron effect). From above, it is realized that the inactive cluster boron dopants in the ultra shallow junction S/D extension 32 are redundant and does not help to reduce the sheet resistance thereof.

It is therefore one object of the present invention to provide an advanced MOS transistor structure having ultra-shallow junction source/drain extensions with active boron concentration that is greater than the maximum boron solid solubility in silicon within a certain junction depth.

The preferred embodiment in accordance with the present invention will be discussed in detail with reference to FIG. 4 to FIG. 12. It is understood that the type of semiconductor regions, device layout, and polarity of voltages are chosen solely for illustration, and persons having ordinary skill in the art would recognize other alternatives, variations, and modifications.

Figure 4:
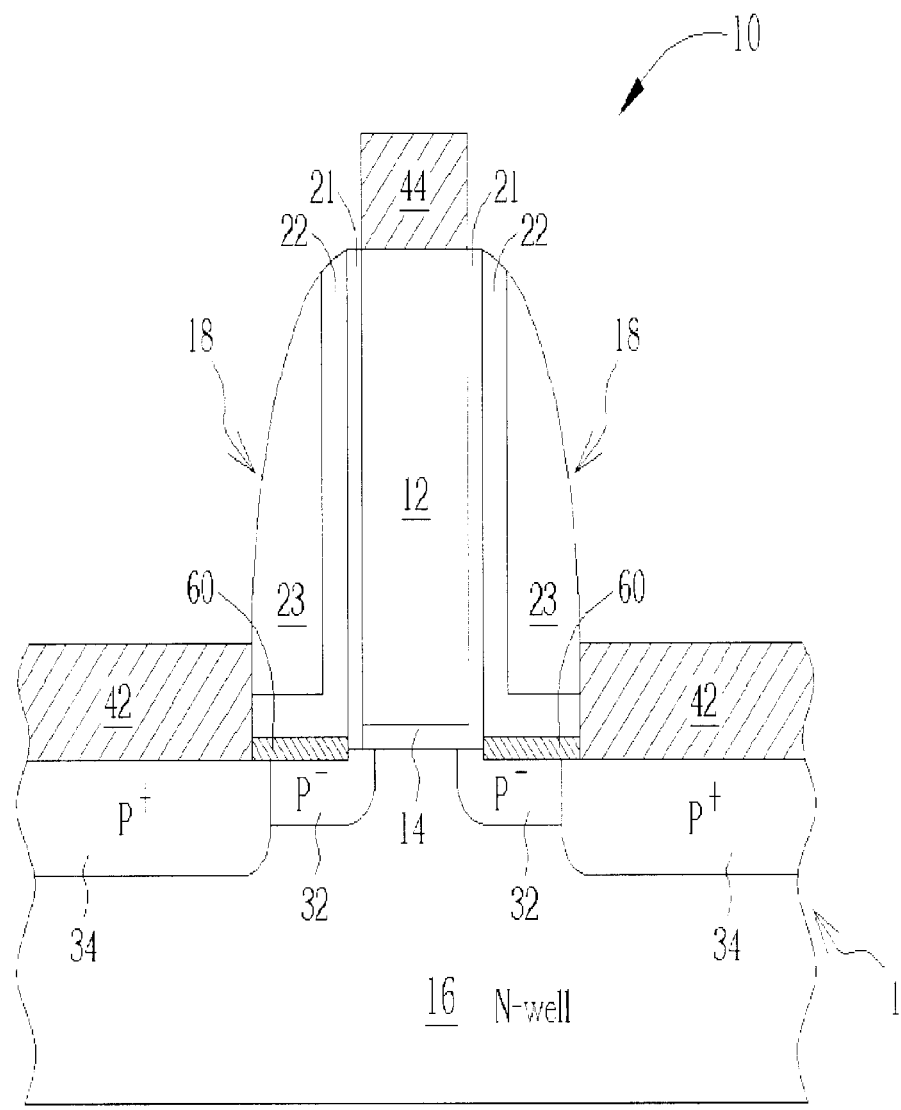
FIG. 4 is a schematic cross-sectional diagram illustrating a MOS transistor having ultra-shallow junction S/D extensions according to one preferred embodiment of this invention.

Please refer to FIG. 4. FIG. 4 is a schematic cross-sectional diagram illustrating a PMOS transistor 10 having ultra-shallow junction S/D extensions 32 according to one preferred embodiment of this invention, in which like reference numerals designate similar or corresponding elements, regions, and portions. As shown in FIG. 4, The PMOS transistor 10 includes a poly gate 12 formed on an N well 16 of a silicon substrate 1. A gate oxide layer 14 is formed between the gate 12 and the silicon substrate 1. Spacers 18 are disposed on opposite sidewalls of the poly gate 12. A P$^-$ ultra-shallow junction S/D extension 32 is formed underneath each of the spacers 18 within the N well 16. An epitaxial layer 60 other than single crystal epi-silicon is interposed between the spacer 18 and the P$^-$ ultra-shallow junction S/D extension 32. The epitaxial layer 60, which is also part of the P$^-$ ultra-shallow junction S/D extension 32, has a lattice constant that is greater than the lattice constant of single crystal silicon. Preferably, the epitaxial layer 60 is composed of silicon germanium (SiGe), but not limited thereto. Other epi materials such as SiGeC are also suitable. The epitaxial layer 60 has a thickness of preferably 50 to 100 angstroms, and a germanium molar ratio of 10% to 30%, preferably 25%. In effect, the epitaxial layer 60 serves as a solubility enhancement layer that is capable of increasing active boron concentration and thereby eliminating above-said cluster boron effect and therefore reducing sheet resistance in the P$^-$ ultra-shallow junction S/D extension 32. Since the boron solid solubility in SiGe epitaxial layer 60 is greater than the boron solid solubility in silicon (2E20 atoms/cm$^3$@1000° C. anneal temperature), the sheet resistance of the P$^-$ ultra-shallow junction S/D extension 32 can be further reduced. Still referring to FIG. 4, the PMOS transistor 10 further comprises a raised cobalt silicide layer 42 formed on P$^+$ S/D region 34 next to the outer edge of the spacer. 18. The cobalt silicide layer 42 may be formed by using a known selective epitaxial growth (SEG), followed by a self-aligned silicide (silicide) process. A silicide layer 44 is formed on the top of the poly gate 12. The spacer 18 consists of an offset oxide spacer 21 stuck to the sidewall of the poly gate 12, an oxide liner 22, and a nitride spacers 23. The oxide liner 22 covers the offset oxide spacer 21 and its lower portion extends laterally to overlie the SiGe epitaxial layer 60. In accordance with the preferred embodiment of the present invention, the SiGe epitaxial layer 60 is only formed on the P$^-$ ultra-shallow junction S/D extension region 32. To prevent germanium of the epitaxial layer 60 from affecting the cobalt silicide process carried out on the S/D diffusion regions 34, the epitaxial layer 60 formed on the S/D diffusion regions 34 is completely removed.

Figure 5:
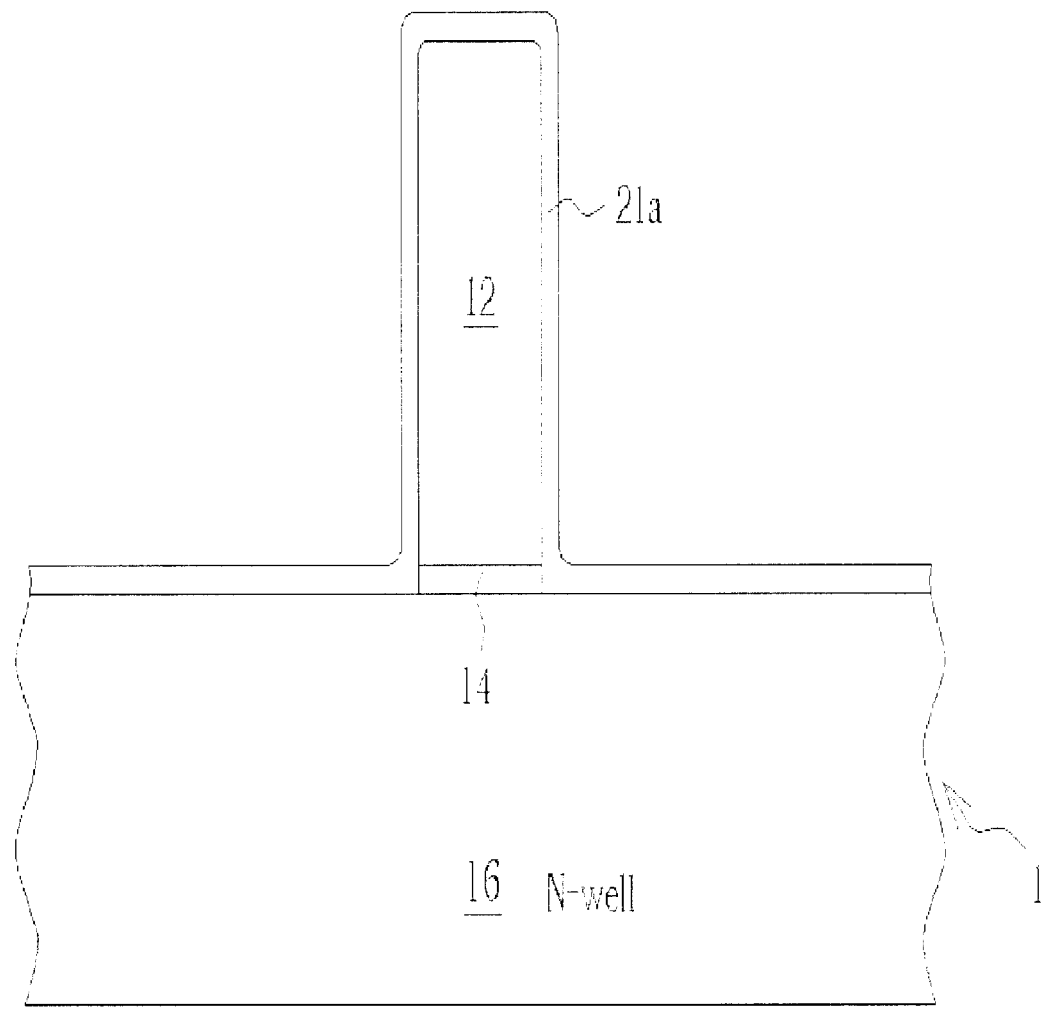
FIG. 5 to FIG. 12 are schematic cross-sectional diagrams showing the fabrication of the MOS transistor with ultra-shallow junction S/D extensions according to the present invention.

Please refer to FIG. 5 to FIG. 12. FIG. 5 to FIG. 12 are schematic cross-sectional diagrams showing the fabrication of the PMOS transistor 10 with ultra-shallow junction S/D extensions 32 according to the present invention. It is appreciated that the fabrication process of the present invention should not be limited to PMOS transistors, but rather may be applied to other devices such as NMOS or CMOS fabrication processes. First, as shown in FIG. 5, a semiconductor substrate 1 preferably a single crystal silicon substrate is provided. The semiconductor substrate 1 comprises an N well 16 surrounded by shallow trench isolation region (not shown). A gate oxide layer 14 and a polysilicon layer are sequentially formed on the semiconductor substrate 1. A conventional lithographic process and a dry etching process are then carried to define the poly gate structure 12 with a line width to a sub-micron scale. After the definition of the gate electrode 12, an offset spacer layer 21a with a thickness of about 100 to 150 angstroms is deposited on the gate electrode 12 and the surface of the semiconductor substrate 1. In this embodiment, the offset spacer layer 21a is a CVD oxide layer, but not limited thereto.

Figure 6:
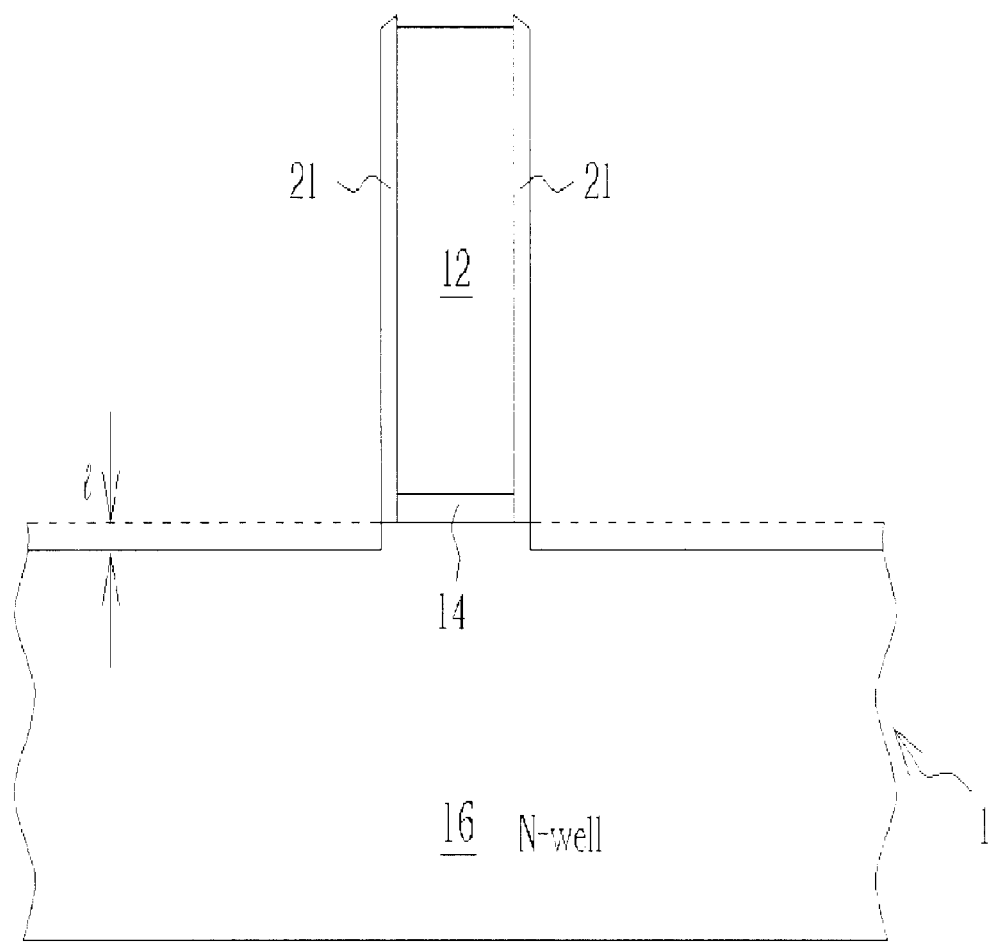

As shown in FIG. 6, the offset spacer layer 21a is etched back to form offset spacers 21 on opposite sidewalls of the gate electrode 12. It is noted that the etching also etches a thickness l of the semiconductor substrate 1 at both side of the gate electrode 12 to form recesses having a depth of approximately 50 to 100 angstroms (l=50 to 100 angstroms). It is also noted that a top portion of the poly gate 12 is etched away.

Figure 7:
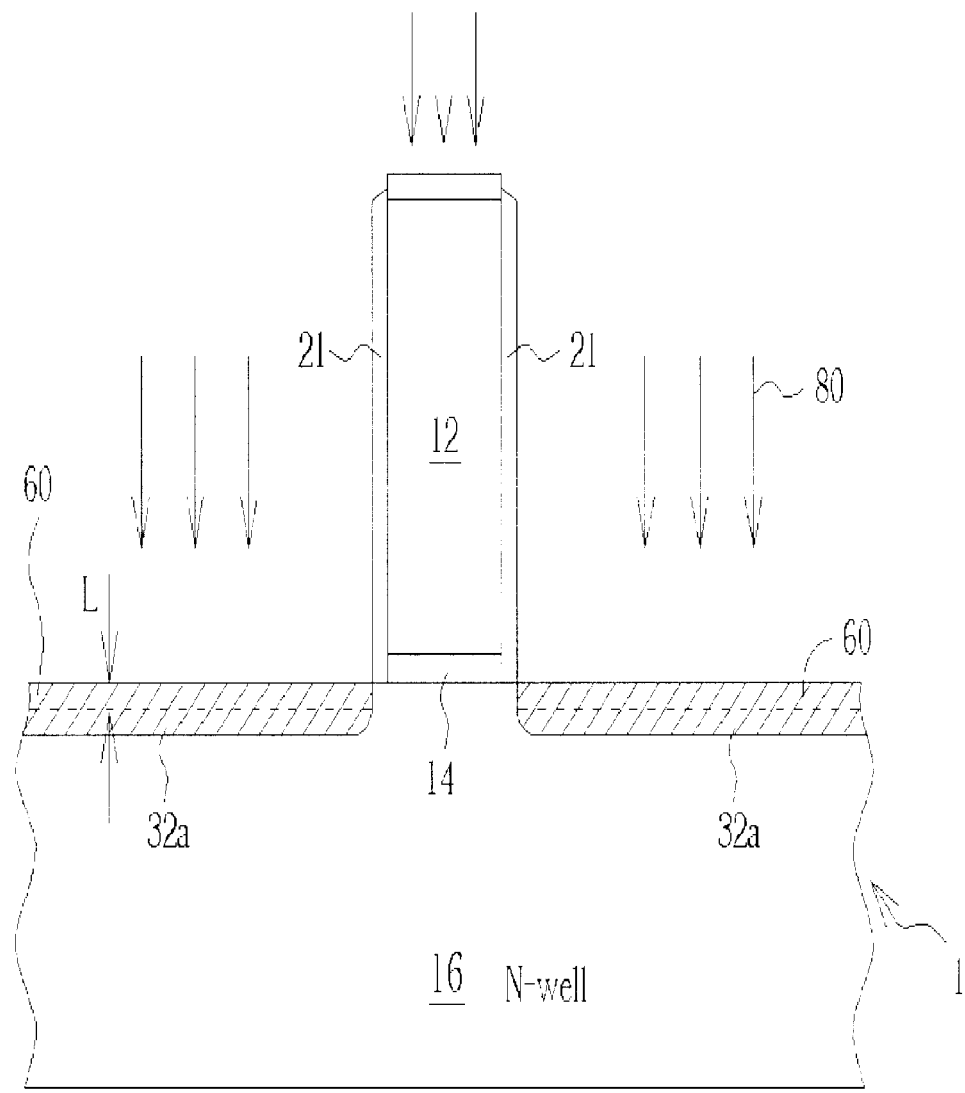

As shown in FIG. 7, an epitaxial process is then carried out to grow an epitaxial layer 60 in the recesses at both sides of the gate electrode 12 on the semiconductor substrate 1. Preferably, the epitaxial layer 60 has a thickness L of 50 to 100 angstroms, more preferably, 75 angstroms. In accordance with the preferred embodiment of the present invention, L≧l. The epitaxial layer 60 is composed of silicon germanium (SiGe), but not limited thereto. Other epi materials such as SiGeC are also suitable. The epitaxial layer 60 has a germanium molar ratio of 10% to 30%, preferably 25%. As noted, the epitaxial layer 60 serves as a solubility enhancement layer that is capable of increasing active boron concentration and thereby eliminating above-said cluster boron effect and therefore reducing sheet resistance in the P$^-$ ultra-shallow junction S/D extension 32. Since the boron solid solubility in SiGe epitaxial layer 60 is greater than the boron solid solubility in silicon (2E20 atoms/cm$^3$@1000° C. anneal temperature), the sheet resistance of the P$^-$ ultra-shallow junction S/D extension 32 can be further reduced. Subsequently, a low-energy and low-dose ion implantation process 80 is carried out to implant boron dopants into the epitaxial layer 60 and the N well 16 using the poly gate 12 and the offset spacers 21 as an implant mask so as to form lightly doped areas 32a in the epitaxial layer 60 and the N well 16, as indicated.

Figure 8:
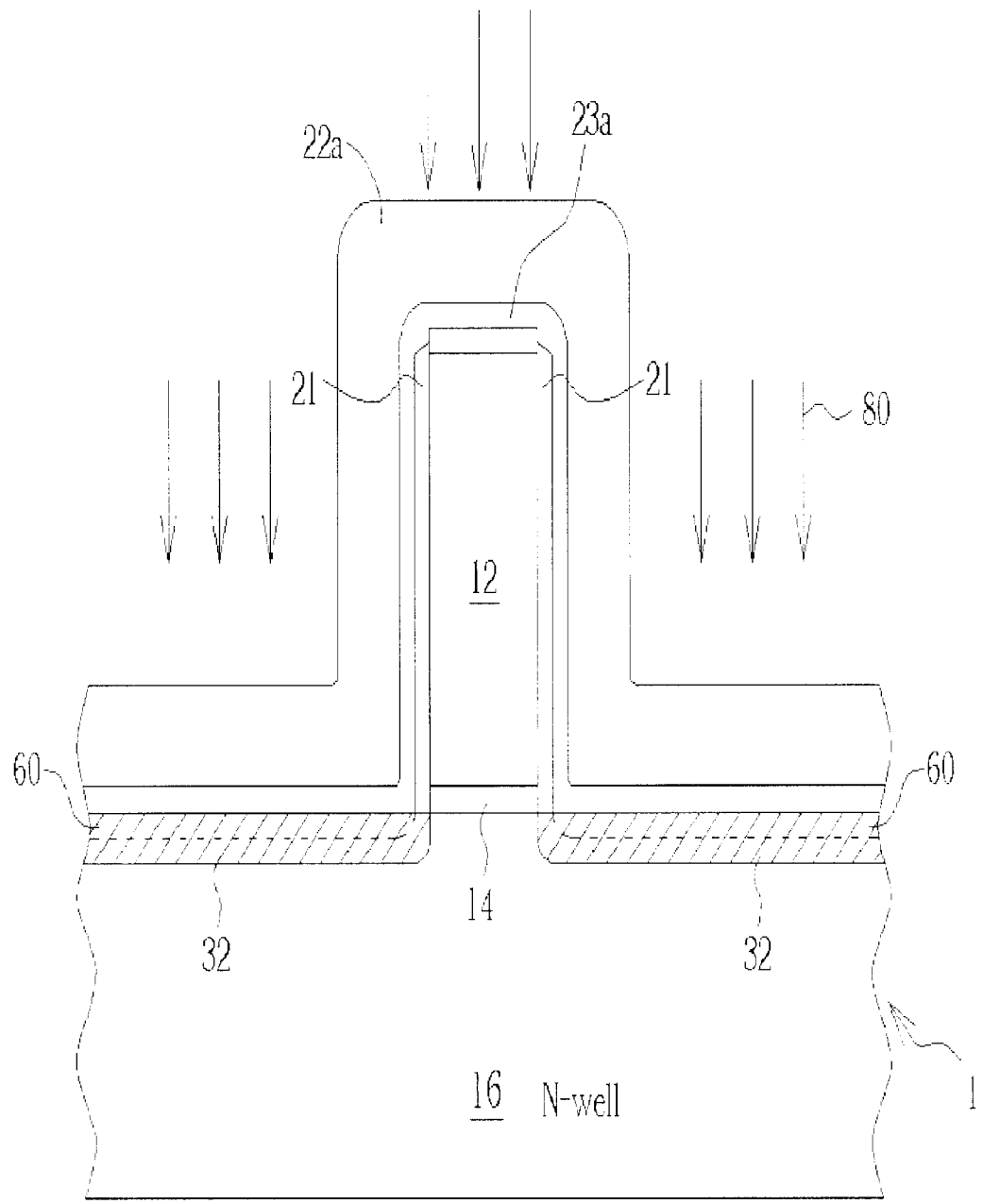

As shown in FIG. 8, in accordance with the preferred embodiment, a RTP anneal process is performed at 1000° C. to activate dopants in the lightly doped areas 32a to form P$^-$ ultra-shallow junction S/D extensions 32. It is appreciated that other annealing techniques such as spike RTA, ARC annealing, o laser annealing may be used. In another case, the RTP anneal may be carried out after the implant of S/D regions. According to this invention, the P$^-$ ultra-shallow junction S/D extension 32 has a junction depth of about 150 to 400 angstroms. The concentration of active boron dopants in the top 50 to 75 angstrom (i.e., in the epitaxial layer 60) of the P$^-$ ultra-shallow junction S/D extension 32 is much greater than the maximum solid solubility of boron in silicon by several orders in magnitude. That is, in this case, the active boron concentration exceeds 2E20 atoms/cm$^3$ and the above-said cluster boron effect is eliminated. Thereafter, a liner 22a and a silicon nitride layer 23a are deposited on the semiconductor substrate 1.

Figure 9:
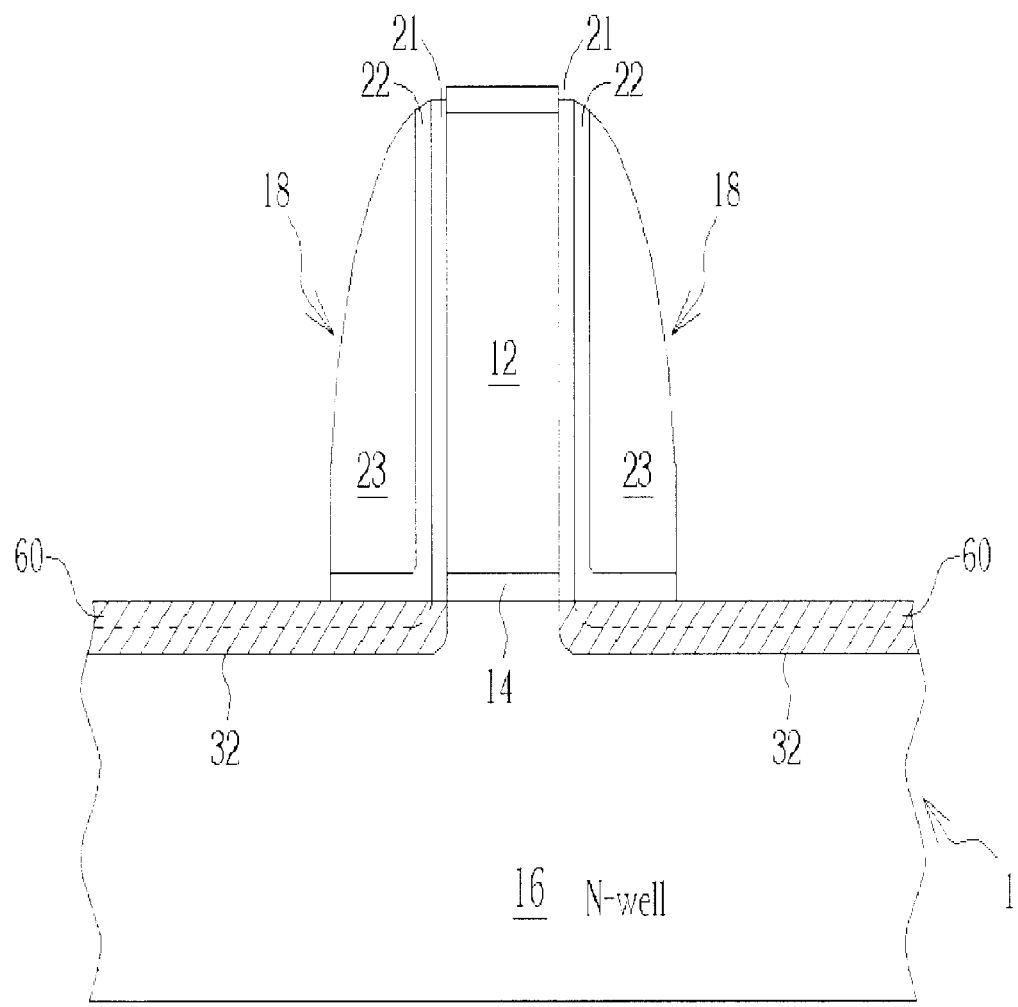

As shown in FIG. 9, the silicon nitride layer 23a and the liner 22a are anisotropically etched back to form spacers 18. The spacer 18 consists of the of f set oxide spacer 21, the oxide liner 22, and the nitride spacer 23. The oxide liner 22 covers the offset oxide spacer 21 and its lower portion extends laterally to overlie the SiGe epitaxial layer 60.

Figure 10:
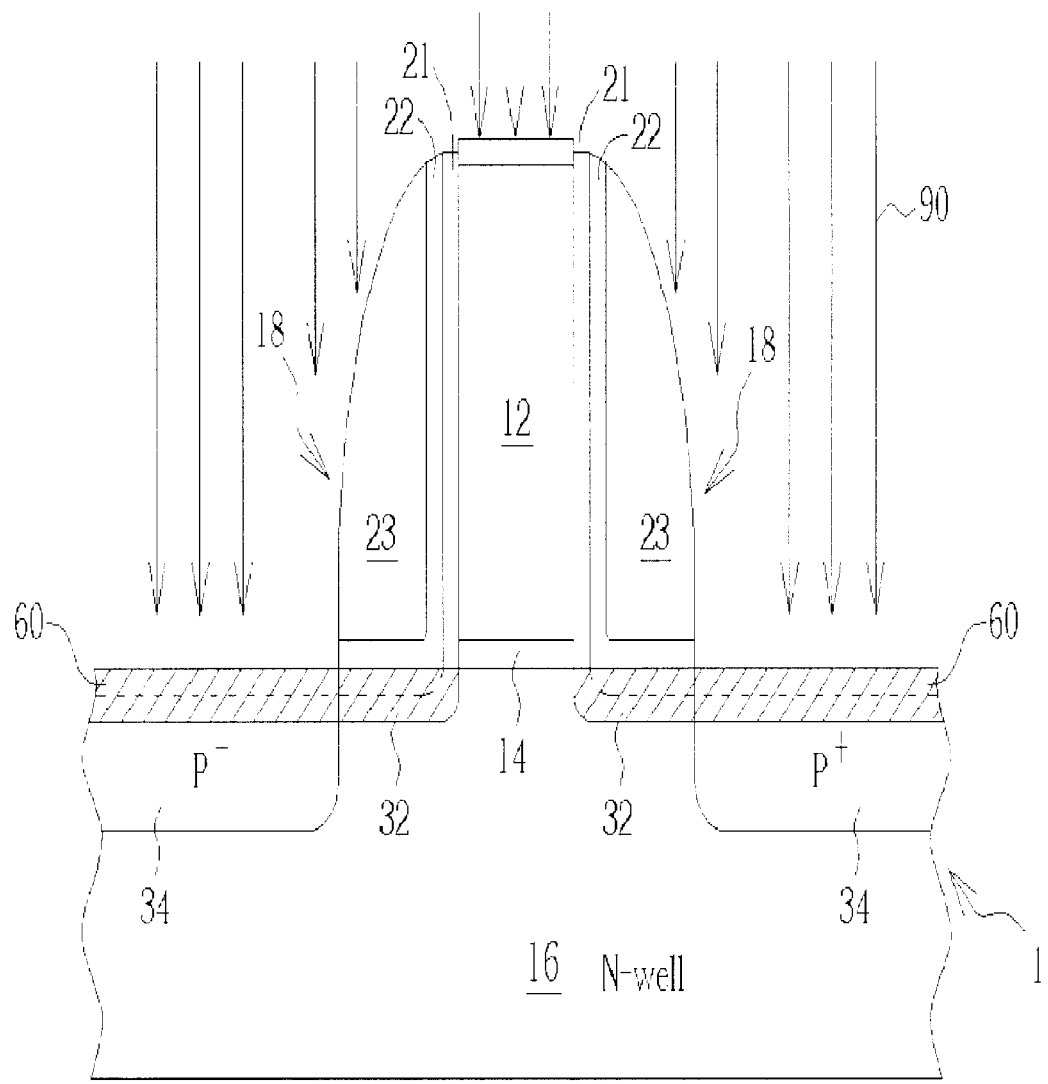

As shown in FIG. 10, using the poly gate 12 and the spacers 18 as an implant mask, a high-energy and high dose ion implantation 90 is then carried out to implant high-dose boron into the N well 16 of the semiconductor substrate 1 so as to form $P^+$ S/D doping regions 34 having a junction depth of approximately 1000 angstroms.

Figure 11:
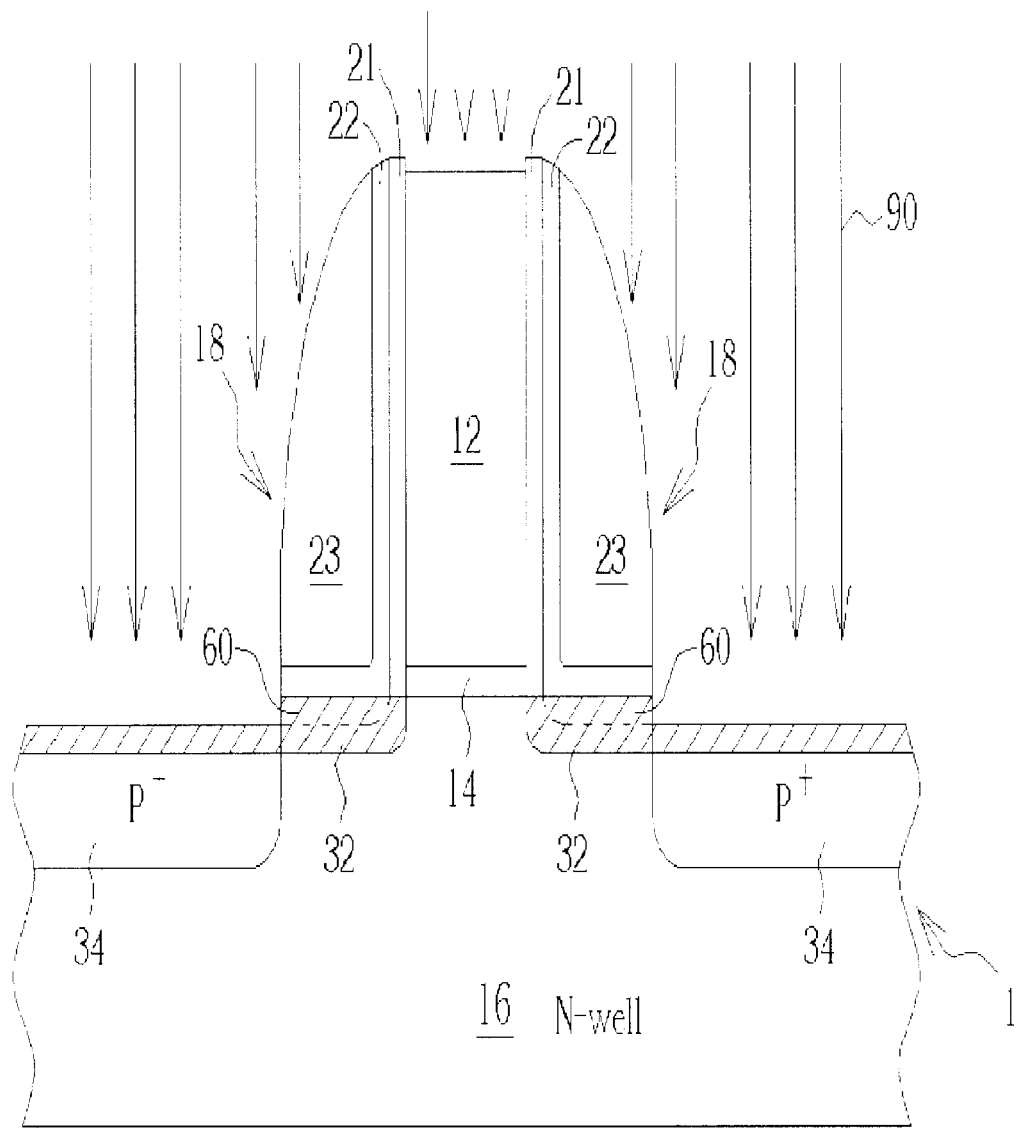

As shown in FIG. 11, in accordance with the preferred embodiment of this invention, the SiGe epitaxial layer 60 on the $P^+$ S/D doping regions 34 are then completely removed. The method of removing the SiGe epitaxial layer 60 involves the use of APM (ammonium hydrogen peroxide mixture) solution at 70° C.

In this case, the composition of the APM solution comprises $NH_4HO:H_2O_2:DI$ water=1:4:20.

Figure 12:
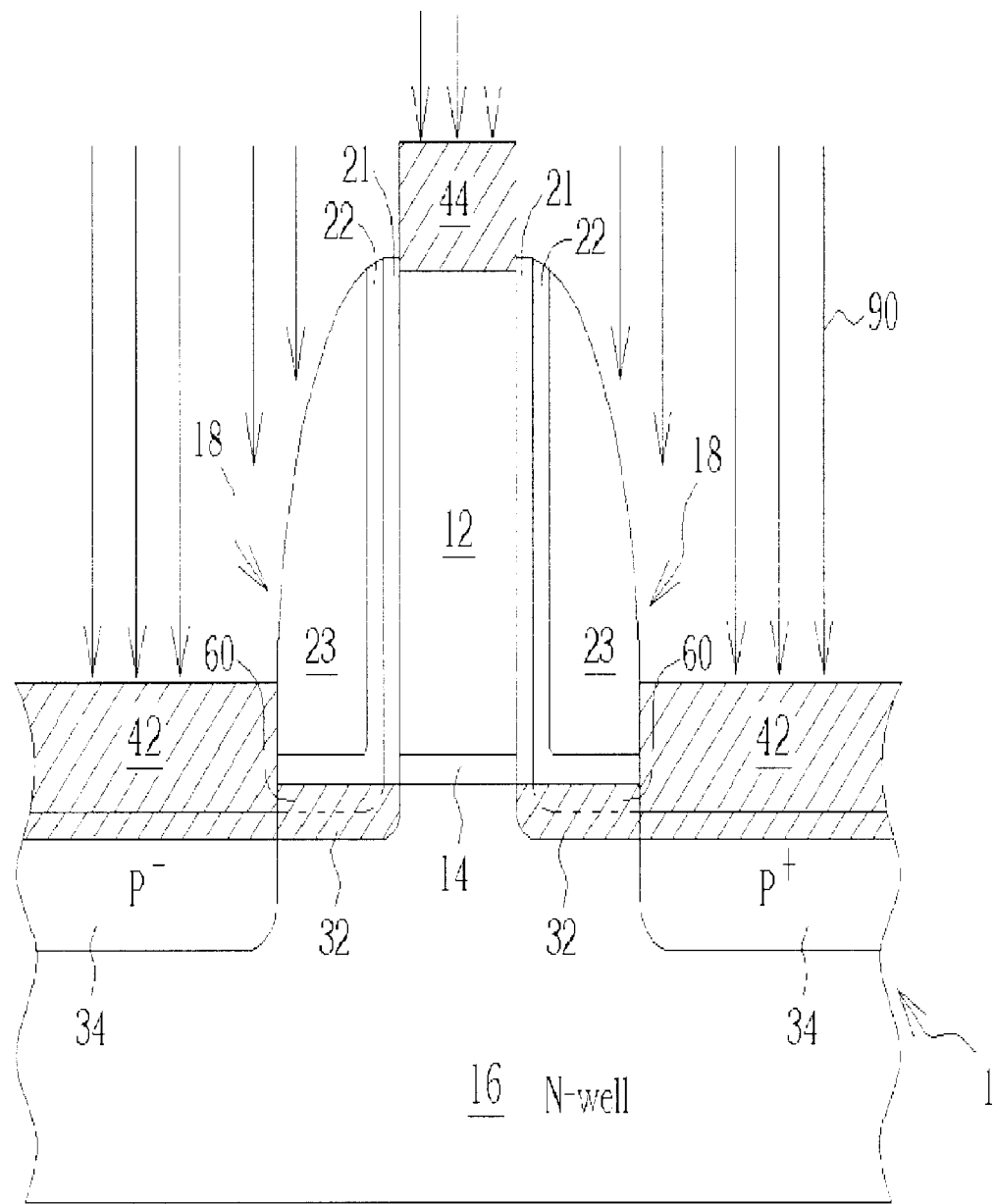

As shown in FIG. 12, a selective epitaxial growth (SEC) is performed to selectively grow a silicon epitaxial layer (not explicitly shown) on the $P^+$ S/D doping regions 34 and on the poly gate 12. Finally, a silicide process is performed to form silicide layers 42 and 44. It to be appreciated that the silicide layers 42 and 44 may be made of cobalt silicide, Ti silicide, Ni silicide, or the like.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A metal-oxide-semiconductor (MOS) transistor structure having reduced sheet resistance in the source/drain extensions, comprising:

a gate electrode formed on a semiconductor substrate;

a gate insulating layer formed between the gate electrode and the semiconductor substrate;

a spacer disposed on each sidewall of the gate electrode;

a lightly doped source/drain (S/D) extension formed in the semiconductor substrate under the spacer, the lightly doped S/D extension comprising a raised epitaxial layer bordering bottom of the spacer; wherein the spacer consists of an offset spacer, a liner and a silicon nitride spacer, and wherein the liner directly overlies the epitaxial layer;

a heavily doped S/D region formed in the semiconductor substrate next to an outer edge of the spacer; and a silicide layer formed on the heavily doped S/D region.

2. The MOS transistor structure of claim 1 wherein the epitaxial layer has a lattice constant that is greater than the lattice constant of single silicon crystal.

3. The MOS transistor structure of claim 1 wherein the epitaxial layer serves to increase active concentration and solid solubility of dopants implanted into the lightly doped S/D extension.

4. The MOS transistor structure of claim 3 wherein the dopants are boron.

5. The MOS transistor structure of claim 1 wherein the epitaxial layer comprises silicon and germanium.

6. The MOS transistor structure of claim 5 wherein the epitaxial layer has a germanium molar ratio of 10% to 30%.

7. The MOS transistor structure of claim 1 wherein the epitaxial layer has a thickness of about 50 to 100 angstroms.

8. A metal-oxide-semiconductor (MOS) transistor, comprising:

a gate formed on a silicon substrate;

a gate insulating layer formed between the gate and the silicon substrate;

lightly doped source/drain (S/D) extensions formed at both sides of the gate in the silicon substrate, each of the lightly doped S/D extensions comprising a raised epitaxial layer having an active concentration of implanted dopants that is greater than a maximum active concentration of said dopants in the silicon substrate, wherein the epitaxial layer has a germanium molar ratio of 10% to 30%; and a heavily doped S/D region formed in the silicon substrate and is contiguous with each of the lightly doped S/D extensions.

9. The MOS transistor of clam 8 wherein the MOS transistor further comprises a spacer disposed on a sidewall of the gate and the raised epitaxial layer is disposed underneath the spacer.

10. The MOS transistor of claim 8 wherein the dopants are boron.

11. The MOS transistor of claim 8 wherein the epitaxial layer has a lattice constant that is greater than the lattice constant of single silicon crystal.

12. The MOS transistor of claim 8 wherein the epitaxial layer comprises silicon and germanium.

13. The MOB transistor of claim 8 wherein the epitaxial layer has a thickness of about 50 to 100 angstroms.

* * * * *